(12) United States Patent
Neuhäusler

(10) Patent No.: US 10,819,274 B2
(45) Date of Patent: Oct. 27, 2020

(54) DEVICE AND METHOD FOR OPTIMALLY ADJUSTING THE LENS PLATE IN A CPV MODULE

(71) Applicant: GRENZEBACH MASCHINENBAU GMBH, Asbach-Baeumenheim (DE)

(72) Inventor: Ulrich Neuhäusler, Diedorf (DE)

(73) Assignee: GRENZEBACH MASCHINENBAU GMBH, Asbach-Baeumenheim (DE)

( * ) Notice: Subject to any disclaimer, the term of this patent is extended or adjusted under 35 U.S.C. 154(b) by 47 days.

(21) Appl. No.: 14/779,289

(22) PCT Filed: Apr. 10, 2014

(86) PCT No.: PCT/DE2014/000186
§ 371 (c)(1),
(2) Date: Sep. 22, 2015

(87) PCT Pub. No.: WO2014/166477
PCT Pub. Date: Oct. 16, 2014

(65) Prior Publication Data
US 2016/0056757 A1 Feb. 25, 2016

(30) Foreign Application Priority Data
Apr. 11, 2013 (DE) .................. 10 2013 006 264

(51) Int. Cl.
*H02S 40/22* (2014.01)
*H02S 30/00* (2014.01)
(Continued)

(52) U.S. Cl.
CPC .......... *H02S 40/22* (2014.12); *H01L 31/0543* (2014.12); *H02S 20/32* (2014.12);
(Continued)

(58) Field of Classification Search
CPC .... H02S 30/00–22; H02S 40/20; H02S 40/22; H02S 50/00; H02S 50/10;
(Continued)

(56) References Cited

U.S. PATENT DOCUMENTS

| 4,834,805 A | 5/1989 | Erbert |
| 5,561,492 A * | 10/1996 | Ohsawa .................. G03B 17/38 |
| | | 396/121 |

(Continued)

FOREIGN PATENT DOCUMENTS

| DE | 10200603479 | 7/2007 |
| DE | 102006007472 | 8/2007 |

(Continued)

OTHER PUBLICATIONS

English machine translation of DE 202011108836 U1 published Feb. 23, 2012 and translation obtained from Espacenet on Dec. 8, 2016.*

(Continued)

*Primary Examiner* — Liesl C Baumann
(74) *Attorney, Agent, or Firm* — Duane Morris LLP; Gregory M. Lefkowitz; Jason M. Nolan

(57) ABSTRACT

The invention relates to a device and a method for optimally adjusting the lens plate in a CPV module which consists of a plurality of CPV sensors and a plurality of lenses mounted over the sensors at a distance from the focal length of said sensors in a container, having the following features: a) a sensor support plate (1) with a plurality of CPV sensors (5), b) a lens plate (2) with a number of lenses, said number corresponding to the number of CPV sensors, c) a fixed lens plate (3) mounted parallel to the position of the lens plate (2), d) a number of sensors which are oriented parallel to the lens plate (3), said number corresponding to the number of CPV sensors, e) two devices (12, 13) for adjusting the lens (Continued)

plate (2) in two horizontal directions, and f) a control device (9) for evaluating output signals, said control device (9) controlling the two devices (12, 13) dependent on characteristics of the output signals.

4 Claims, 6 Drawing Sheets

(51) Int. Cl.
*H01L 31/054* (2014.01)
*G02B 3/00* (2006.01)
*H02S 20/32* (2014.01)

(52) U.S. Cl.
CPC ............ *H02S 30/00* (2013.01); *G02B 3/0075* (2013.01); *Y02E 10/52* (2013.01)

(58) Field of Classification Search
CPC .......... H02S 50/15; H02S 99/00; H02S 20/32; H01L 31/0543; Y02E 10/52; G02B 3/0075
USPC .................................. 136/243–265
See application file for complete search history.

(56) References Cited

U.S. PATENT DOCUMENTS

| | | | |
|---|---|---|---|
| 5,707,458 A | 1/1998 | Nagashima | |
| 9,029,681 B1* | 5/2015 | Nielson | F24J 2/06 136/246 |
| 2006/0051109 A1* | 3/2006 | Lim | G02F 1/133526 399/22 |
| 2008/0115830 A1 | 5/2008 | Shin | |
| 2008/0122803 A1* | 5/2008 | Izadi | G06F 3/0421 345/175 |
| 2009/0126794 A1 | 5/2009 | Dimroth et al. | |
| 2009/0133737 A1* | 5/2009 | Anzawa | F24J 2/5235 136/246 |
| 2009/0272424 A1* | 11/2009 | Ortabasi | H01L 31/0543 136/246 |
| 2010/0066382 A1 | 3/2010 | Merkle | |
| 2011/0163976 A1* | 7/2011 | Barnhoefer | G06F 1/3231 345/173 |
| 2011/0241549 A1* | 10/2011 | Wootton | F21S 8/006 315/117 |
| 2012/0298179 A1 | 11/2012 | Shin et al. | |
| 2013/0019920 A1* | 1/2013 | Kinsey | H01L 31/0543 136/246 |
| 2014/0295611 A1 | 10/2014 | Schmid et al. | |
| 2014/0354597 A1* | 12/2014 | Kitchens, II | G06F 1/3215 345/175 |

FOREIGN PATENT DOCUMENTS

| | | | |
|---|---|---|---|
| DE | 202011108836 | * 12/2011 | ......... H01L 21/6715 |
| EP | 2071634 | 6/2009 | |
| JP | 11-031838 | 2/1999 | |
| JP | 2010-34134 | 12/2010 | |
| KR | 20110014084 | 2/2011 | |
| WO | 2012/083118 | 6/2012 | |
| WO | 2012/149022 | 11/2012 | |

OTHER PUBLICATIONS

Gale, Michael T., et al., "Active alignment of replicated microlens arrays on a charge-coupled device imager," Optical Engineering, May 1997, vol. 36, No. 5, pp. 1510-1517.

* cited by examiner

DEVICE AND METHOD FOR OPTIMALLY ADJUSTING THE LENS PLATE IN A CPV MODULE

CROSS-REFERENCE TO RELATED APPLICATIONS

This application is a § 371 national stage entry of International Application No. PCT/DE2014/000186, filed Apr. 10, 2014, which claims priority to German Patent Application No. 10 2013 006 264.0 filed Apr. 11, 2013, the entire contents of which are incorporated herein by reference.

BACKGROUND

For many years, there have already been approaches in photovoltaics for working with concentrated solar radiation. In this case, the radiation of the sun is concentrated by means of mirrors and/or lenses, and oriented onto special concentrator solar cells. Corresponding systems of concentrating photovoltaics (CPV) are presently being tested in the Spanish solar research institute Instituto de Sistemas Fotovoltaicos de Concentracion (ISFOC) in Castille at Puertollano. They bundle the sunlight using lenses or mirrors to 400 to 1000 times the intensity, before it is incident on small solar cells, which are significantly more efficient than classical silicon solar cells. Producers from many parts of the world have installed CPV modules on the test site there. Presently, approximately 1000 modules are installed on this site. The researchers are developing, inter alia, yield prognoses and are testing the long-term stability, to make the transition of this technology from development into the market easier.

Up to this point, 50-100 CPV pilot systems are in operation worldwide. The total output thereof is approximately 30 MW. A current study of the American market research institute Greentechmedia Research predicts an increasing career for this technology, however, and the journal "PV Manufacturing" also predicts an increasing demand for automated manufacturing capacity in issue 13 (September 2011).

The core of such systems are the high-performance solar cells, which are presently used above all in outer space. There, they have already supplied satellites and robots with power for years. Instead of silicon, these cells contain so-called compound semiconductors made of gallium, indium, arsenic, or phosphorus. They consist of multiple different semiconductor layers, each of which processes a different range of the sunlight spectrum, while classical silicon cells can only convert a smaller part of the sunlight spectrum into electrical current.

Inter alia, the following prior art is known from the patent literature.

A photovoltaic force module is disclosed in U.S. Pat. No. 4,834,805 A, having the following features.

An arrangement of photovoltaic semiconductor crystal cells distributed in individual cell locations in a layered substrate, wherein they are enclosed by two electrically conductive layers and are separated by means of an insulating layer. Furthermore, this module consists of a light-conveying layer made of lenses, which is arranged at a distance to the layered substrate, wherein incident radiation is focused in the light-conveying layer by means of the lenses into the substrate, and wherein the thickness of the lens layer, the substrate layer, and the space in between is less than 2 inches.

A photovoltaic concentrator module is known from DE 10 2006 007 472 A1, having a lens plate and a base plate, on which solar cells are housed, and a frame, wherein the frame is arranged, connecting the lens plate and the base plate, circumferentially along the edge of the lens plate and the base plate.

This known concentrator module is to be improved such that it can be produced cost-effectively, is long-lived, and enables additional components to be integrated simply and flexibly, which can be housed only with difficulty or not at all on the lens plate or the base plate. In addition, a method is to be developed, which enables the production of such concentrator modules.

The object stated here is achieved in that, along the frame between the lens plate and the frame and/or the base plate and the frame, on the one hand, at least one first sealant mass and/or adhesive mass and, on the other hand, at least one second sealant mass is arranged circumferentially at least on a part of the length of the frame, wherein the two sealant masses and/or adhesive masses differ with respect to the curing time and/or gas permeability thereof.

A method for producing a photovoltaic concentrator module characterized by the following features:
namely that a frame is arranged, connecting a lens plate and a base plate, along the edge of the lens plate and the base plate, and, between the frame and the lens plate and/or the frame and the base plate, on the one hand, at least one first sealant mass and/or adhesive mass and, on the other hand, at least one second sealant mass is introduced along the frame circumferentially over at least a part of its length, wherein the two sealant and/or adhesive masses differ with respect to the curing times and/or gas permeabilities thereof.

DE 10 2006 034 793 A1 discloses a testing device for a PV concentrator module, a method for testing a PV concentrator module with the aid of this testing device, and a production method of a PV concentrator module tested using this device. PV stands for photovoltaic in this case. This document is based on the object of providing a possibility for quality control for a PV concentrator module and in particular a possibility for testing the efficiency and/or other technical parameters of a PV concentrator module before the final assembly and/or after the final assembly for testing the finished module. A testing method for testing, or a production method for producing a PV concentrator module are also to be provided, so that a PV concentrator module is simple to test, or to be produced with a reliable quality.

To achieve this object, a testing device for a PV concentrator module is claimed having a first light source for generating light which simulates solar radiation, which furthermore contains an optics system, which bundles the light beams originating from the first light source with a divergence of the individual light beams of less than 2° and is capable of orienting this light bundle onto a light incidence surface of the PV concentrator module. Furthermore, this testing device has a measuring device for measuring an output signal of the PV concentrator module irradiated by the light bundle.

In this document, the testing method disclosed therein is also provided for application before and/or after the final assembly for quality control. An application of the function sequences described here, or parts thereof, directly in the production process is not provided, however.

SUMMARY OF THE INVENTION

The device according to the invention and the corresponding method are based on the object of proposing a device and a method, using which industrially produced concentrator modules can be produced cost-effectively and reliably and a reliable final check can be carried out, so that a high long-term stability of a concentrator module is achieved in practical operation.

This object is achieved with a device for optimally adjusting the lens plate (2) in a CPV module, which consists of a plurality of CPV sensors (5), which are arranged in a surface, in a sensor carrier plate (1) and a plurality of lenses, which are attached above this at the distance of the focal length thereof in a lens plate (2), wherein both plates (1, 2) are housed in a weather-insensitive housing, having the following features:
  a) a sensor carrier plate (1) having a plurality of CPV sensors (5), wherein a settable electrical power can be applied to the CPV sensors (5),
  b) a lens plate (2) having a number of lenses corresponding to the number of the CPV sensors, wherein the lenses are mounted essentially parallel to the horizontal location of the CPV sensors (5) in the region of the optical axis thereof,
  c) a fixed lens plate (3) mounted in parallel to the location of the lens plate (2),
  d) a number, corresponding to the number of CPV sensors (5), of quadrant sensors (4), which are aligned in parallel to the lens plate (3), and the geometrical center point of which is located at a distance of the focal length of the lenses of the lens plate (3) on the optical axis thereof,
  e) two devices (12, 13) for adjusting the lens plate (2) in two horizontal directions, which are aligned at a right angle to one another,
  f) a control unit (9) for analyzing output signals of the quadrant sensors (4), wherein the control unit (9) controls the two devices (12, 13) in dependence on the quality of the output signals of the quadrant sensors (4) and the supplied electrical power of the CPV sensors (5).

Or, in another embodiment, a device for optimally adjusting the lens plate (2) in a CPV module, which consists of a plurality of CPV sensors (5), which are arranged in a surface, in a sensor carrier plate (1) and a plurality of lenses, which are attached above this at the distance of the focal length thereof in a lens plate (2), wherein both plates (1, 2) are housed in a weather-insensitive housing, having the following features:
  a) a sensor carrier plate (1) having a plurality of CPV sensors (5),
  b) a lens plate (2) having a number of lenses corresponding to the number of the CPV sensors (5), wherein the lenses are mounted essentially parallel to the horizontal location of the CPV sensors (5) in the region of the optical axis thereof,
  c) a fixed lens plate (3) mounted in parallel to the location of the lens plate (2),
  d) a number, corresponding to the number of CPV sensors (5), of punctiform light sources (6), which are aligned in parallel to the lens plate (3), and the geometrical center point of which is located at a distance of the focal length of the lenses of the lens plate (3) on the optical axis thereof,
  e) two devices (12, 13) for adjusting the lens plate (2) in two horizontal directions, which are aligned at a right angle to one another,
  f) a control unit (9) for analyzing output signals of the CPV sensors (5), wherein the control unit (9) controls the two devices (12, 13) in dependence on the quality of the output signals of the CPV sensors (5).

In some embodiments, the device comprises a further device is provided for adjusting the lens plate (2) in the vertical direction.

In some embodiments, the device comprises after adjustment of the lens plate (2), a device is provided for joint-free pressing in of silicone sealant mass (15).

In some embodiments, a method for optimally adjusting the lens plate (2) in a CPV module is disclosed. The method comprising a plurality of CPV sensors (5), which are arranged in a surface, in a sensor carrier plate (1) and a plurality of lenses, which are attached above this at the distance of the focal length thereof in a lens plate (2), wherein both plates (1, 2) are housed in a weather-insensitive housing, having the following features:
  a) opposite to a sensor carrier plate (1) having a plurality of CPV sensors (5), wherein a settable electrical voltage and/or a settable electrical current can be applied to the CPV sensors (5) to excite them to emit light, a lens plate (2) is movably fixed, wherein the lens plate (2) has a number of lenses corresponding to the number of the CPV sensors (5), and wherein the lenses are mounted essentially parallel to the horizontal location of the CPV sensors (5) in the region of the optical axis thereof,
  b) a fixed lens plate (3) is mounted in parallel to the location of the lens plate (2), wherein parallel beam bundles radiate through this lens plate, and wherein quadrant sensors (4) are located at the distance of the focal length of the lenses of the fixed lens plate (3) on the side facing away from the lens plate (2),
  c) the lens plate (2) is displaced according to plan in two horizontal directions, which are perpendicular to one another, by two devices (12, 13) until an optimum alignment of the optical axes of the CPV sensors (5) and the lenses of the lens plate (2) is achieved by means of the quadrant sensors (4).

Or, in another embodiment, a method for optimally adjusting the lens plate (2) in a CPV module, which consists of a plurality of CPV sensors (5), which are arranged in a surface, in a sensor carrier plate (1) and a plurality of lenses, which are attached above this at the distance of the focal length thereof in a lens plate (2), wherein both plates (1, 2) are housed in a weather-insensitive housing, having the following features:
  a) opposite to a sensor carrier plate (1) having a plurality of CPV sensors (5), a lens plate (2) is movably fixed, wherein the lens plate (2) has a number of lenses corresponding to the number of the CPV sensors (5), and wherein the lenses are mounted essentially parallel to the horizontal location of the CPV sensors (5) in the region of the optical axis thereof,
  b) a fixed lens plate (3) is mounted in parallel to the location of the lens plate (2), wherein punctiform light sources (6) are located at the distance of the focal length of the lenses of the fixed lens plate (3) on the side facing away from the lens plate (2),
  c) the lens plate (2) is displaced according to plan in two horizontal directions, which are perpendicular to one another, by two devices (12, 13) until an optimum alignment of the optical axes of the CPV sensors (5) and the lenses of the lens plate (2) is achieved by means of the ascertainment of a maximum yield of electrical power, wherein randomly distributed inhomogeneities in the internal structure of the relevant CPV sensor (5) can be taken into consideration.

In some embodiments, the method is characterized in that a further device is provided for adjusting the lens plate (2) in the vertical direction.

In some embodiments, the method is characterized in that joint-free pressing in of silicone sealant mass (15) is performed after completed adjustment of the lens plate (2) by means of a device.

In some embodiments, a computer program having a program code for carrying out the method steps as described herein when the program is executed in a computer is described.

In some embodiments, a machine-readable carrier having the program code of a computer program for carrying out the method as described herein when the program is executed in a computer is described.

BRIEF DESCRIPTION OF THE DRAWINGS

The device according to the invention will be described in greater detail hereafter. In the individual figures.

DETAILED DESCRIPTION OF THE INVENTION

Figure 1:
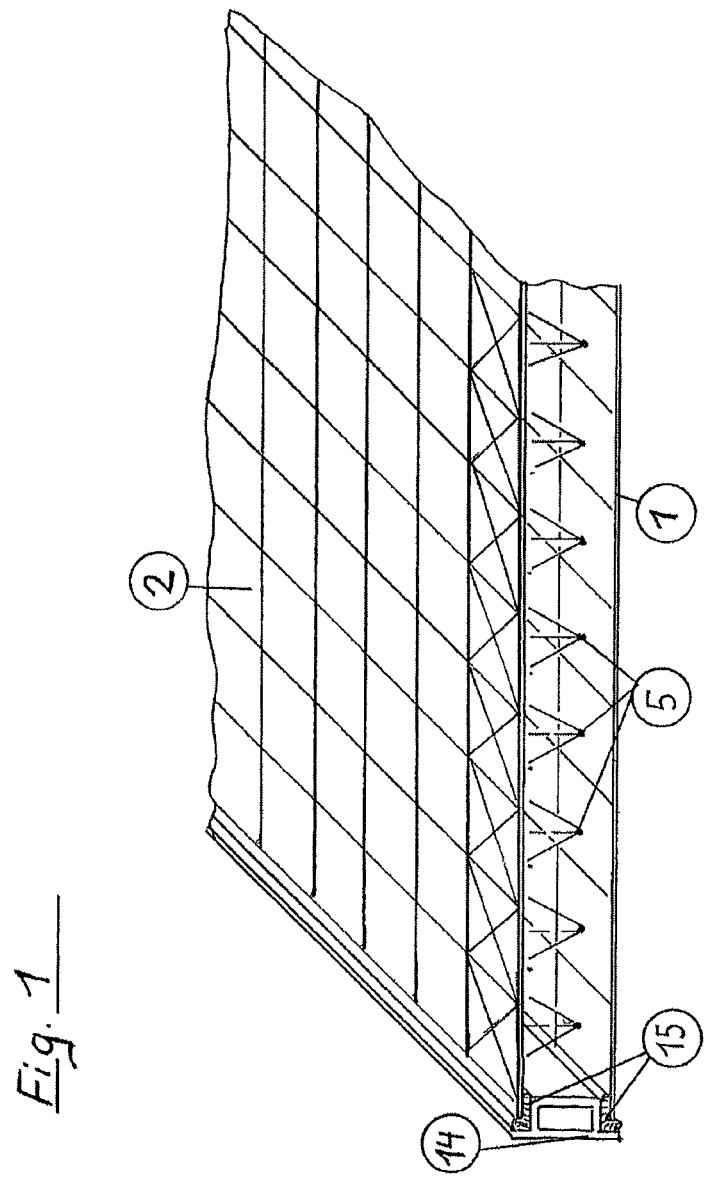
FIG. 1: shows an illustration of the schematic structure of a CPV module

FIG. 1 shows an illustration of the schematic structure of a CPV module. A CPV module essentially consists of a sensor carrier plate 1, which contains a plurality of CPV sensors 5 arranged adjacent to one another, and a lens plate 2 aligned in parallel above it, which also consists of a plurality of lenses arranged adjacent to one another, usually Fresnel lenses. A module frame 14, which is shown in FIG. 1 on the left side in cross section, is used for holding the two plates 1 and 2. The structural dimension which essentially determines the distance of the two plates 1 and 2 is the height of the module frame 14. This height of the module frame 14 corresponds to the focal length of the lens type used in the lens plate 2. In this way, it is ensured that sunlight incident on the lens plate 2, in light beams extending in parallel from the sun, is concentrated exactly in the center of the CPV sensor 5 associated with each lens. However, this is required not only in the horizontal X-Y direction, but rather also in the vertical direction. Therefore, during the adjustment of a lens plate 2, the thickness of the silicone sealant mass 15 between the module frame 14 and the lens plate 2, and between the module frame 14 and the sensor carrier plate 1, is also to be taken into consideration. The thickness of the silicone sealant mass 15 between the sensor carrier plate 1 and the module frame 14 is essentially fixed, but can be varied during the manufacturing process in specific limits, however. At the point in time of the adjustment of a lens plate, however, the sensor carrier plate 1 is already connected to the module frame 14.

Figure 2:
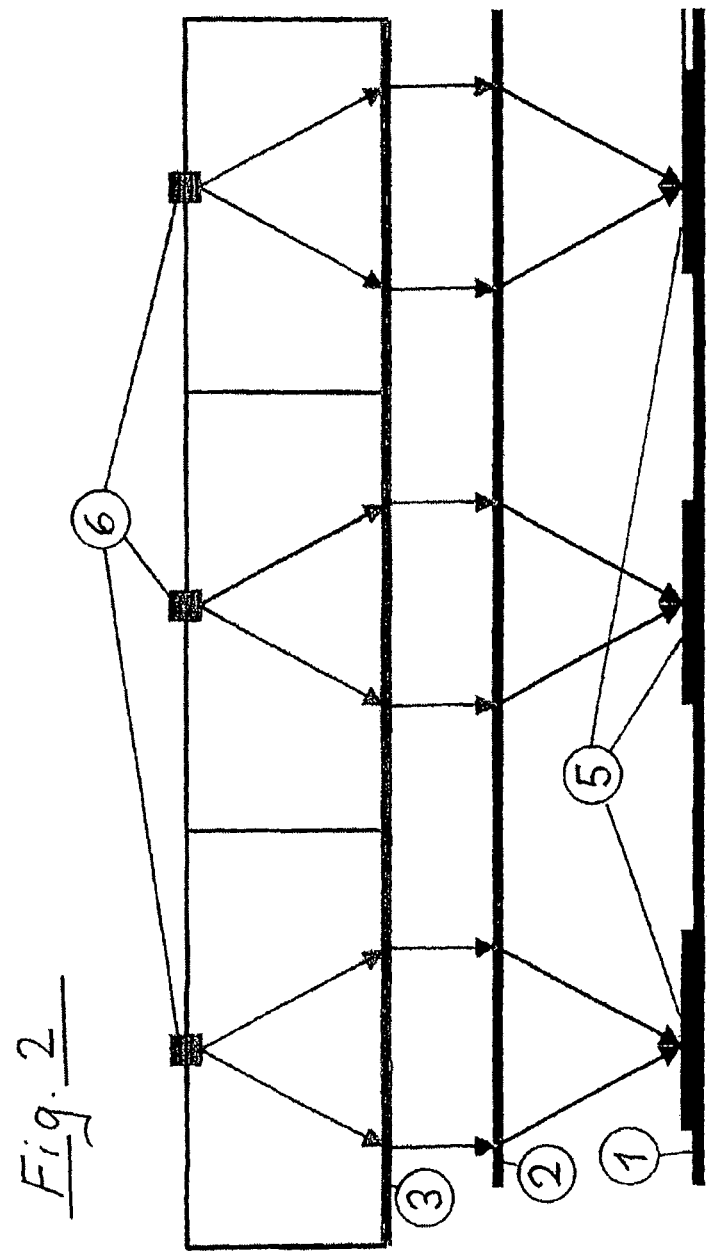
FIG. 2: shows an illustration of the first method of an adjustment of a lens plate
Figure 6:
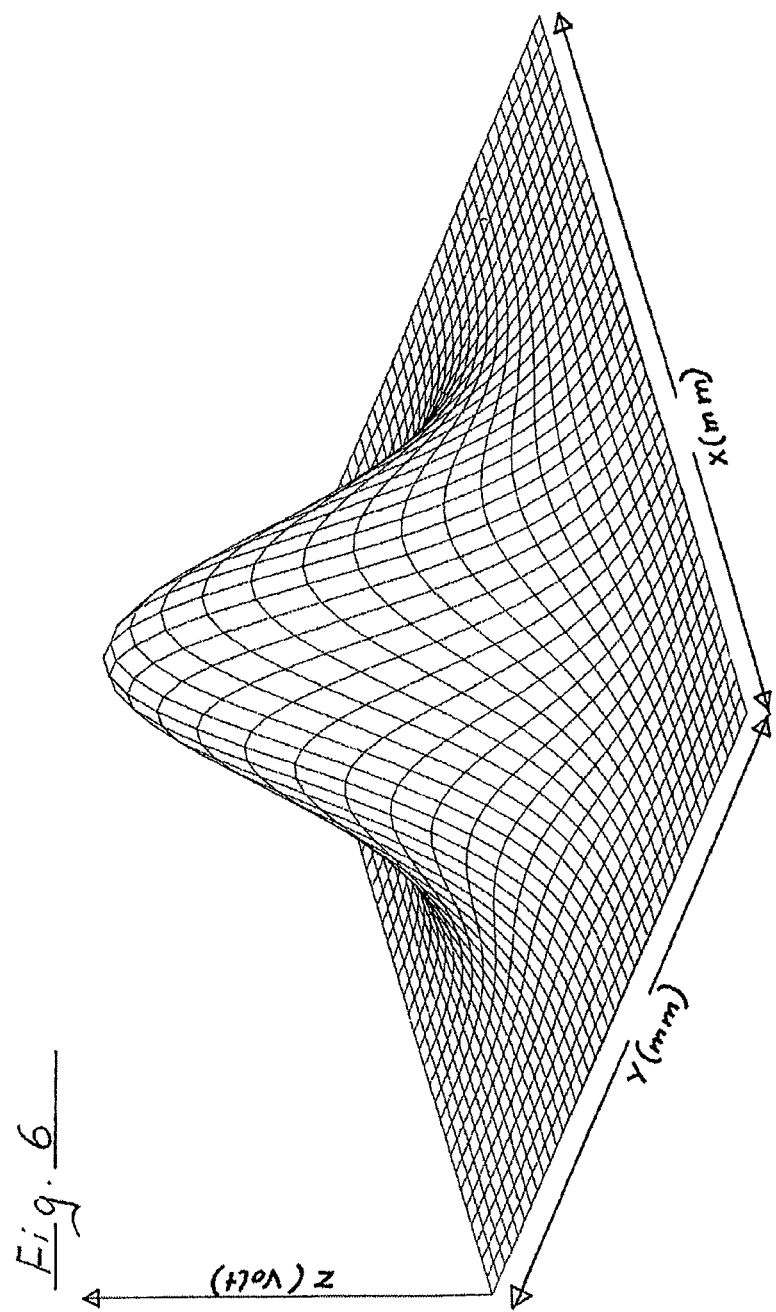
FIG. 6: shows a current and voltage profile in a CPV sensor.

FIG. 2 shows an illustration of the first method of an adjustment of a lens plate 2. The method shown here, the so-called first method, is a method in which the natural procedure of solar radiation is simulated in that a further fixed lens plate 3 having identical dimensions of the lenses as the lens plate 2 is connected upstream in a parallel location to the lens plate 2 to be adjusted, wherein punctiform light sources are installed in the focal points of the lenses on the lens plate 3. In this manner, it is ensured that the fixed lens plate 3 emits light beams extending in parallel in the direction of the lens plate 2 to be adjusted. If the lens plate 2 to be adjusted is now displaced incrementally in a horizontal direction, the CPV sensors 5 illuminated by the lens plate 2 will thus individually, and of course also in total, generate a different electrical voltage and a different current. By means of a planned strategy of steps of the displacement of the lens plate 2 and a following voltage or current measurement in each case, the optimum alignment of the lens plate 2 in relation to the sensor carrier plate 1 can then be ascertained. For a receiver chip assumed to be ideal, of homogeneous sensitivity over the entire sensor surface, the optimum alignment is characterized in that a maximum electrical power is measured on the sensor carrier plate. For illustration, a high-quality modeled profile of such a two-dimensional current or voltage distribution is shown in FIG. 6. In the case of circular sensors, which do not have a homogeneous sensitivity over the entire region, the actual current/voltage profile can deviate in relation to the qualitative example. The optimum operating point is then to be determined on the basis of symmetry considerations.

Proceeding from this optimum alignment in the horizontal direction, an adjustment in the vertical direction can then be performed, which is characterized by a voltage and/or current maximum and essentially determines the thickness or the mass of the silicone sealant mass introduced later.

Figure 4:
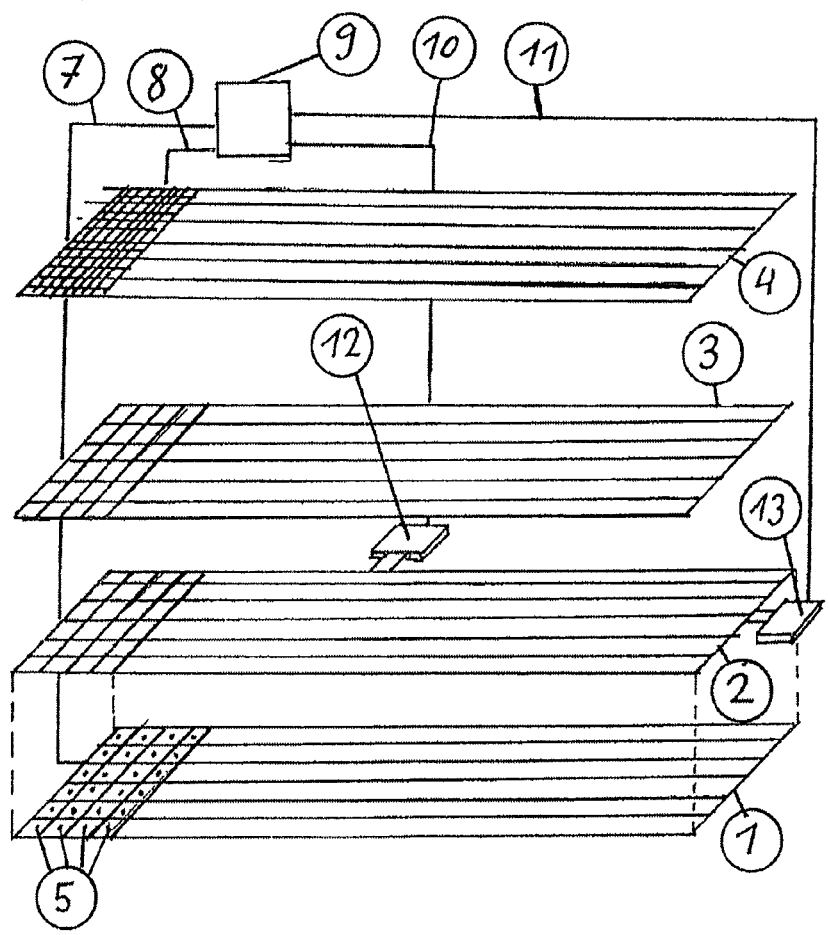
FIG. 4: shows a schematic overview of an adjustment procedure

A schematic illustration of such an adjustment procedure can be inferred from FIG. 4.

Figure 3:
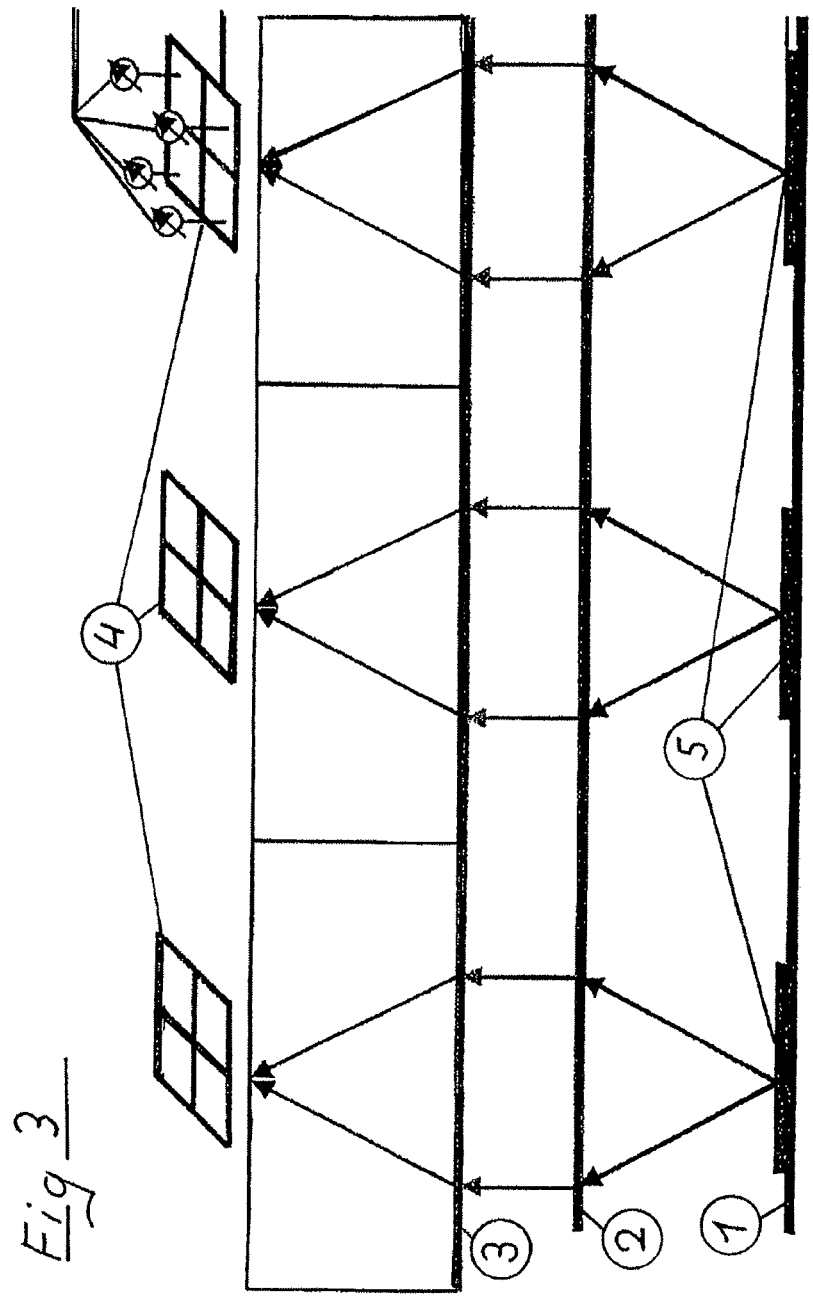
FIG. 3: shows an illustration of the second method of an adjustment of a lens plate

FIG. 3 shows a further, second method having similar structure as in the first method already illustrated in FIG. 2, but with inverted beam path, i.e., more or less an inverse operation. The CPV sensors 5 are not evaluated with respect to the electrical power thereof here, but rather themselves become light-emitting elements having controllable power according to the electroluminescence effect, in that a specific electrical direct current is supplied in each case to the individual CPV sensors 5 themselves and the light emitted thereby is detected and quantitatively evaluated by means of quadrant sensors 4. The distance of the CPV sensors 5 to the lens plate 2 essentially corresponds to the focal length of the lenses used in the lens plate 2, which results in light beams extending in parallel between the lens plate 2 and the lens plate 3, which is automatically pre-adjusted in relation to the quadrant sensors 4. The lens plate 3 can be displaced in the X, Y, and Z directions of the coordinate system. The adjustment device for the lens plate 3 is not shown for reasons of comprehensibility. Since the quadrant sensors 4 are attached at the distance of the focal length of the lens plate 3, which is fixed in the position aligned to the quadrant sensors 4, each illuminating CPV sensor 5 is imaged on the corresponding quadrant photodiode 4. This imaging occurs as a 1:1 image when the fixed lens plate 3 has the same focal length as the lens plate 2 to be aligned. However, a shrinking image (focal length of the lens plate 3 is less than the focal length of the lens plate 2) or an enlarging image (focal length of the lens plate 3 is greater than the focal length of the lens plate 2) are also possible in principle. For reasons of simplification and replaceability, however, it is advisable for the lens plates 2 and 3 to be identical not only in the lens dimensions, but rather also in the focal length thereof, i.e., that the same lens plate type can be used.

FIG. 4 shows a schematic overview of an adjustment procedure of a lens plate 2 according to the so-called second method. Four different planes are shown here, of which the lowermost symbolizes a sensor carrier plate 1 having a number of CPV sensors 5. The closest, following plane 5 shows an associated lens plate 2 having a rear adjustment device 12 and a front adjustment device 13. These two adjustment devices 12 and 13 enable a displacement of the lens plate 2 in two horizontal directions X and Y in a three-dimensional coordinate system X, Y, and Z, wherein the possibility of a displacement in the Z direction is not shown here for reasons of the overview. The closest plane illustrates a fixed lens plate 3, as is mentioned in each case in the description of FIG. 2 and FIG. 3.

The quadrant sensors 4 are indicated in the uppermost plane of FIG. 4. A data line 8 to a control unit 9 is shown symbolically here for all quadrant sensors installed therein. This control unit 9 also ensures the setting of the power supply of the individual CPV sensors 5 via the line 7. Furthermore, the control unit 9 controls the rear adjustment device 12 and the front adjustment device 13 by means of the control lines 10 and 11, respectively.

The adjustment of the lens plate 2 in the vertical Z direction is also not shown here.

In the case of an adjustment procedure according to the first method, punctiform light sources, for example, LED lights, are located in the place of the quadrant sensors 4, and the control unit 9 with the control line 7 is not used for the power supply of the CPV sensors, but rather extracts the electrical power generated thereby and yields it for analysis.

Figure 5:
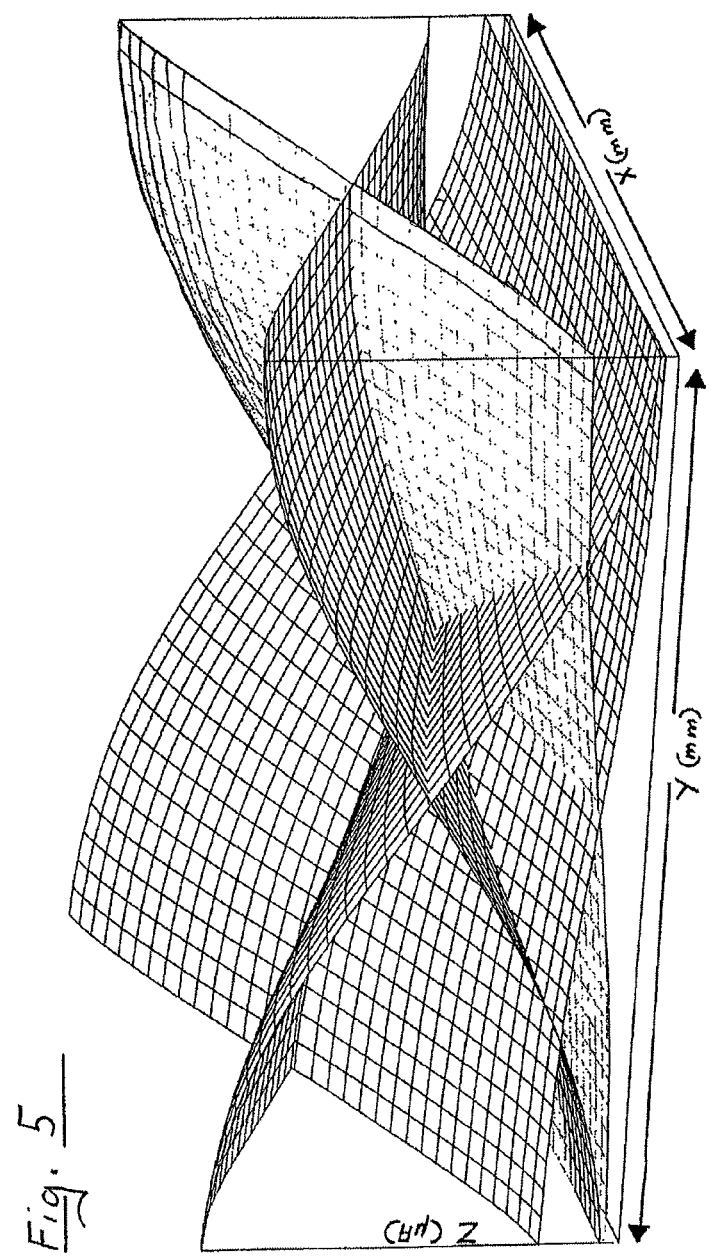
FIG. 5: shows an overview of the power distribution of a quadrant sensor

FIG. 5 shows a schematic overview of the qualitative current distribution to be expected in the four quadrants of a quadrant sensor 4 in dependence on the X and Y positions of the lens plate 2 to be aligned. The origin of the four quadrants in this diode lies on the optical axis, optimum alignment is therefore precisely provided when an identical diode current can be measured on all four quadrants, when the four differential signals of diodes adjacent in pairs are minimal.

The positioning accuracy for this measurement method is dependent on the achievable accuracy of the mechanical displacement process. An accuracy of less than 20 μm is achievable by a compensation of the mechanical tolerances. For this measurement arrangement, the signals to be expected from a silicon quadrant photodiode are in the order of magnitude of 10 to 100 μA, these are typical values for the dark current in the nA range. This can result in high signal-to-noise ratios. The signal gradient is very high in the event of a location change for method 1 and method 2.

Finally, FIG. 6 shows an illustration of the voltage profile in a CPV sensor.

A CPV submodule typically consists of several hundred individual CPV sensors. Since the CPV sensors already assembled on the base plate also have a certain random deviation from the ideal position thereof, to determine the optimum alignment of the entirety of the sensors of the CPV sensor carrier plate, a reasonable selection of CPV sensors, which are distributed over the lens plate at various positions, has to be used. Since then CPV sensors which are not used metrologically are always still available, both methods can also be used in parallel, wherein the appropriate decisions with respect to the XYZ coordinates required for the adjustment are then made automatically by the control program on the basis of the results. Instead of the lens plate 4, as described in FIG. 3 and FIG. 4, the CPV sensor carrier plate 1 of the concentrator module can be aligned in relation to the lens plate 3 by an adjustment system. The requirement is the quadrant sensors or LEDs and lens plate 3 and lens plate 4 are aligned in relation to one another in an optical line.

The complex control of the described movement sequences requires a special control program.

LIST OF REFERENCE NUMERALS 1 sensor carrier plate
2 lens plate
3 fixed lens plate
4 quadrant sensor
5 CPV sensor
6 punctiform light source
7 power supply for CPV sensors
8 data line for quadrant sensors
9 control unit
10 control line for rear adjustment device
11 control line for front adjustment device
12 rear adjustment device
13 front adjustment device
14 module frame
15 silicone sealant mass

The invention claimed is:

1. A device for optimally adjusting a concentrating photovoltaic (CPV) module, the CPV module comprising:
a sensor carrier plate (1) comprising a plurality of CPV sensors (5), which are arranged on a surface of the sensor carrier plate (1) and
a plurality of lenses arranged in a lens plate (2), which is positioned above the sensor carrier plate (1) at a distance of a focal length of the plurality of lenses,
wherein both plates (1, 2) are in a housing,
wherein a settable electrical power can be applied to the CPV sensors (5),
wherein a number of the plurality of lenses of the lens plate (2) corresponds to a number of the plurality of CPV sensors,
wherein each lens is mounted above a corresponding CPV sensor (5) of the plurality of CPV sensors (5) so an optical axis of the lens of the lens plate (2) is incident to the CPV sensor,
the device comprising:
a fixed lens plate (3) mountable above and parallel to the lens plate (2), the fixed lens plate (3) comprising a plurality of fixed lenses,
a plurality of quadrant sensors (4),
wherein a number of the quadrant sensors (4) corresponds to the number of the CPV sensors (5), wherein the quadrant sensors (4) are aligned above and in parallel to the fixed lens plate (3), wherein a geometrical center point of each quadrant sensor (4) is located at a distance of the focal length of the plurality of fixed lenses of the fixed lens plate (3) so the optical axis of the corresponding fixed lens is incident on the corresponding quadrant sensor (4), and wherein each of the plurality of quadrant sensors (4) comprises four quadrants for detecting light emitted from each of the plurality of CPV sensors (5);
two devices (12, 13) for adjusting the lens plate (2) in two horizontal directions, wherein the two devices are aligned at a right angle to one another,
a further device for adjusting the lens plate (2) in a vertical direction in order to maximize voltage and/or current;
a control unit (9) for analyzing output signals of the quadrant sensors (4), wherein the control unit (9) controls the two devices (12, 13) based on the output signals of the quadrant sensors (4) and the supplied electrical power of the CPV sensors (5);

wherein said control unit uses a selection of the plurality of quadrant sensors, but not all of the plurality of quadrant sensors, in order to adjust the position of the lens plate (2); and wherein said control unit adjusts the position of the lens plate (2) until all four quadrants for each of the selection of the plurality of quadrant sensors have a respective measured diode current that is identical.

2. The device as claimed in claim 1, wherein each of the plurality of quadrant sensors is positioned to detect light emitted by the corresponding CPV sensor.

3. The device as claimed in claim 1, wherein the device comprises a plurality of stacks, each stack comprising a CPV sensor of the plurality of CPV sensors, a lens from the plurality of lenses arranged in the lens plate, a fixed lens of the plurality of fixed lenses from the lens plate, and a quadrant sensor of the plurality of quadrant sensors, wherein, for each stack, the lens is above the CPV sensor, the lens is between the fixed lens and the CPV sensor, and the fixed lens is between the quadrant sensor and the lens.

4. The device as claimed in claim 3, wherein, for each stack, light emitted from the CPV sensor passes through the lens, then through the fixed lens, and is detected by the quadrant sensor.

\* \* \* \* \*